(12) United States Patent
Straub, Jr. et al.

(10) Patent No.: US 8,136,411 B2
(45) Date of Patent: Mar. 20, 2012

(54) TRANSDUCER HAVING A ROBUST ELECTRICAL CONNECTION TO A PIEZOELECTRIC CRYSTAL

(75) Inventors: Henry Charles Straub, Jr., Sugar Land, TX (US); Charles Wayne Melvin, Sugar Land, TX (US)

(73) Assignee: Daniel Measurement and Control, Inc., Houston, TX (US)

( * ) Notice: Subject to any disclaimer, the term of this patent is extended or adjusted under 35 U.S.C. 154(b) by 140 days.

(21) Appl. No.: 12/759,175

(22) Filed: Apr. 13, 2010

(65) Prior Publication Data

US 2010/0257942 A1    Oct. 14, 2010

Related U.S. Application Data (60) Provisional application No. 61/168,757, filed on Apr. 13, 2009.

(51) Int. Cl.
*G01F 1/58* (2006.01)
(52) U.S. Cl. .................................................. 73/861.12
(58) Field of Classification Search ............... 73/861.12, 73/861.15, 861.25
See application file for complete search history.

(56) References Cited

U.S. PATENT DOCUMENTS

| | | | |
|---|---|---|---|
| 3,886,792 A | 6/1975 | Change et al. | |
| 4,297,607 A | 10/1981 | Lynnworth et al. | |
| 5,784,340 A * | 7/1998 | Kanai | 367/140 |
| 6,508,133 B1 | 1/2003 | Adachi et al. | |
| 7,307,373 B2 | 12/2007 | Straub, Jr. et al. | |
| 7,397,168 B2 | 7/2008 | Straub, Jr. et al. | |

OTHER PUBLICATIONS

PCT International Search Report (PCT/US2010/030857) issued Nov. 30, 2010, Korean Intellectual Property Office (ISA/KR), (3 pages).
PCT Written Opinion of the International Searching Authority (PCT/US2010/030857) issued Nov. 30, 2010, Korean Intellectual Property Office (ISA/KR), (3 pages).
Caldon; Ultrasonic Custody Transfer Flow Meter; LEFM 240C Four Path Ultrasonic Flow Meter; May 4, 2005; (6 p.).
Caldon; LEFM 240Ci/240C Ultrasonic Flow Meters; Undated; (1 p.).
Caldon; LEFM 280C Ultrasonic Flow Meters; Undated; (1 p.).
Caldon; Product Specifications; LEFM 280C Ultrasonic Flow Meters; Undated; (1 p.).
Krohne; Altosonic V12; Ultrasonic Gas Meter for Custody Transfer; Undated; (1 p.).
Krohne; Optisonic V6; Ultrasonic Gas Meter for Non-Custody Transfer; Undated; (1 p.).

* cited by examiner

*Primary Examiner* — Jewel V Thompson
(74) *Attorney, Agent, or Firm* — Conley Rose, P.C.

(57) ABSTRACT

An embodiment of a piezoelectric assembly for an ultrasonic flow meter comprises a piezoelectric element including a first face and a second face. In addition, the piezoelectric assembly comprises a first electrode engaging the first face. Further, the piezoelectric assembly comprises a second electrode engaging the second face. Still further, the piezoelectric assembly comprises an electrically conductive shim connector attached to the first electrode. Moreover, the piezoelectric assembly comprises a first wire electrically coupled to the shim connector.

22 Claims, 9 Drawing Sheets

TRANSDUCER HAVING A ROBUST ELECTRICAL CONNECTION TO A PIEZOELECTRIC CRYSTAL

CROSS-REFERENCE TO RELATED APPLICATIONS

This application claims benefit of U.S. provisional application Ser. No. 61/168,757 filed Apr. 13, 2009, and entitled "Transducer Having Robust Electrical Connection to Piezoelectric Crystal," which is hereby incorporated herein by reference in its entirety.

STATEMENT REGARDING FEDERALLY SPONSORED RESEARCH OR DEVELOPMENT

Not applicable.

BACKGROUND

1. Field of the Invention

The invention relates generally to the liquid and gas ultrasonic flow meters. More particularly, the invention relates to a robust electrical connection to the piezoelectric crystal of a transducer employed in an ultrasonic flow meter.

2. Background of the Technology

After hydrocarbons have been removed from the ground, the fluid stream (either in a liquid phase or a gaseous phase) is transported from place to place via pipelines. It is desirable to know with accuracy the amount of fluid flowing in the stream, and particular accuracy is demanded when the fluid is changing hands, or during "custody transfer." Even where custody transfer is not taking place, however, measurement accuracy is desirable, and in these situations ultrasonic flow meters may be used.

An ultrasonic flow meter typically includes two or more transducer assemblies, each secured inside of a port in the body of the flow meter. The body of the flow meter may also be referred to as a spool piece. To contain the transported fluid within the flow meter, a connector is secured over the exterior end of each transducer port in the spool piece. Thus, the spool piece and end connectors create a pressure boundary and housing that contains the fluid flowing through the meter.

To measure fluid flow through the meter, a pair of transducer assemblies is positioned along the inner surface of the spool piece, such that each transducer assembly faces the other on opposite sides of the fluid flow through the bore of the spool piece. Each transducer assembly includes a piezoelectric element. When an alternating current is applied to the piezoelectric element of the first transducer assembly of the pair, the piezoelectric element responds by radiating an ultrasonic wave through the fluid flowing through the flow meter. When the wave is incident upon the piezoelectric element of the second transducer assembly of the pair, the second transducer assembly responds by generating an electric signal. Some time later, an alternating current is applied to the piezoelectric element of the second transducer assembly, and the second piezoelectric element responds by radiating an ultrasonic wave through the fluid in the flow meter to the first transducer assembly. When the wave is incident upon the piezoelectric element of the first transducer assembly, that transducer assembly responds by generating an electric signal. In this way, the transducer assemblies transmit and receive signals back-and-forth across the fluid stream.

Each transducer assembly is connected to a cable that extends through the end connector to the exterior of the spool piece and a remote location, such as an electronics base enclosure typically mounted to the outside of the spool piece. The cable carries the electric signal created by the piezoelectric element of the particular transducer assembly to an acquisition board positioned within the electronics base enclosure or electronic package, where the signal may be processed and subsequently used to determine the fluid flow rate through the meter.

Electrical connections to the piezoelectric element allow for the communication of electrical signals to and from the piezoelectric crystal. During operations of an ultrasonic flow meter, temperature fluctuations are a common source of stress on the electrical connections to the piezoelectric element. For example, liquid ultrasonic flow meters can have temperature ratings of −50 to +150° C. or greater and their transducers need to be able to remain functional over the full temperature range. Additionally, ultrasonic flow meters that measure cryogenic liquids such as liquid natural gas (LNG) may experience temperature swings between ambient temperature (approximately 20° C.) or higher and the temperature of the LNG (approximately −161° C.) or lower. Although efforts are made to keep the rate of temperature change low (i.e., keep the change in temperature per unit time low), rapid temperature changes (i.e., thermal shock) can occur. Temperature changes can exert stress on the electrode connections through differences in the coefficients of thermal expansion (CTEs) of the various materials making up the transducer.

The piezoelectric crystal contains two electrodes—a negative electrode and a positive electrode. Typically, an electrical connection to each electrode is accomplished by soldering a wire directly to each electrode. The piezoelectric crystal is held in place in the crystal holder of the transducer assembly using epoxy that also acts as a back matching layer to improve acoustical performance by increasing the bandwidth of the transducer.

Epoxy is often used to encapsulate all or a portion of the piezoelectric crystal and associated wires. In addition to improving acoustical performance, the epoxy also helps to protect the piezoelectric crystal, wires, and electrical connection from corrosion and mechanical shock. The epoxy encapsulation does have a downside, however, in that the CTE of the epoxy typically differs substantially from that of the piezoelectric crystal. Epoxies typically have CTEs of 15 to 100 ppm/° C., while a piezoelectric material such as lead zirconate titanate (PZT) typically has a CTE of approximately 3.6 ppm/° C. For a given temperature change, the epoxy dimensions change more than the piezoelectric crystal dimensions. The net effect is that the dimensional changes of the epoxy tend to exert a force at the point where the wire is attached to the electrode and can cause a portion of the electrode material to break apart from of the piezoelectric material.

The fact that the electrical connection to the electrode tends to be kept as small as possible further worsen the stress problem since it concentrates the stress along a relatively small surface area the electrode. For example, if the electrical connection is a solder joint, it is typically kept as small as possible to minimize heating of the electrode and piezoelectric crystal since too much heat from soldering iron can cause damage to the electrode or piezoelectric material. If the electrical connection is accomplished with conductive epoxy, the electrical connection can be made a little larger by spreading out the individual strands within the wire to increase the area of contact with the electrode but this does increase the difficulty in making the electrical connection.

An alternative method to making the electrical connection to the electrode is to use a spring or spring-loaded mechanism that biases the electrical connection into engagement with the electrode such that the connection can freely slide over the electrode of the piezoelectric crystal. However, this type of electrical connection can degrade over time due to corrosion of the electrode material and/or connection mechanism causing the electrical resistance of the connection to increase over time.

Accordingly, there remains a need in the art for a more robust electrical connection to the electrodes of a piezoelectric element of a transducer assembly. The electrical connection would be particularly well received if it offered the potential to withstand thermal and mechanical stresses experienced during operation over a relatively broad range of temperatures and applications.

BRIEF SUMMARY OF THE DISCLOSURE

These and other needs in the art are addressed in one embodiment by a piezoelectric assembly for an ultrasonic flow meter. In an embodiment, the piezoelectric assembly comprises a piezoelectric element including a first face and a second face. In addition, the piezoelectric assembly comprises a first electrode engaging the first face. Further, the piezoelectric assembly comprises a second electrode engaging the second face. Still further, the piezoelectric assembly comprises an electrically conductive shim connector attached to the first electrode. Moreover, the piezoelectric assembly comprises a first wire electrically coupled to the shim connector.

These and other needs in the art are addressed in another embodiment by an ultrasonic flow meter for measuring the flow of a fluid through a pipeline. In an embodiment, the ultrasonic flow meter comprises a spool piece including a throughbore and a transducer port extending from the outer surface of the spool piece to the throughbore. In addition, the ultrasonic flow meter comprises a transducer assembly disposed in the transducer port. The transducer assembly comprises a case having a central axis, a first end, and a second end opposite the first end. The case also includes a throughbore extending axially between the first end and the second end. Further, the second end comprises an opening to the throughbore of the case. The transducer assembly further comprises a crystal holder at least partially disposed in the throughbore of the case and extending axially from through the opening. The crystal holder is coaxially aligned with the case and has a first end disposed in the throughbore of the case and a second end distal the case. In addition, the transducer assembly comprises a piezoelectric assembly coupled to the second end of the crystal holder. The piezoelectric assembly includes a piezoelectric element extending along a central axis from a first face distal the throughbore of the spool piece to a second face proximal the throughbore of the spool piece. Further, the piezoelectric assembly includes a first electrode disposed on the first face. Still further, the piezoelectric assembly includes a second electrode disposed on the second face. Moreover, the piezoelectric assembly includes a shim connector attached to the first electrode. In addition, the piezoelectric assembly includes a first wire electrically coupled to the shim connector and the first electrode, and a second wire electrically coupled to the second electrode.

Thus, embodiments described herein comprise a combination of features and advantages intended to address various shortcomings associated with certain prior devices, systems, and methods. The various characteristics described above, as well as other features, will be readily apparent to those skilled in the art upon reading the following detailed description, and by referring to the accompanying drawings.

BRIEF DESCRIPTION OF THE DRAWINGS

For a detailed description of the preferred embodiments of the invention, reference will now be made to the accompanying drawings in which.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Certain terms are used throughout the following description and claims to refer to particular features or components. As one skilled in the art will appreciate, different persons may refer to the same feature or component by different names. This document does not intend to distinguish between components or features that differ in name but not function. The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices, components, and connections. In addition, as used herein, the terms "axial" and "axially" generally mean along or parallel to a central axis (e.g., central axis of a body or a port), while the terms "radial" and "radially" generally mean perpendicular to the central axis. For instance, an axial distance refers to a distance measured along or parallel to the central axis, and a radial distance means a distance measured perpendicular to the central axis.

Figure 1:
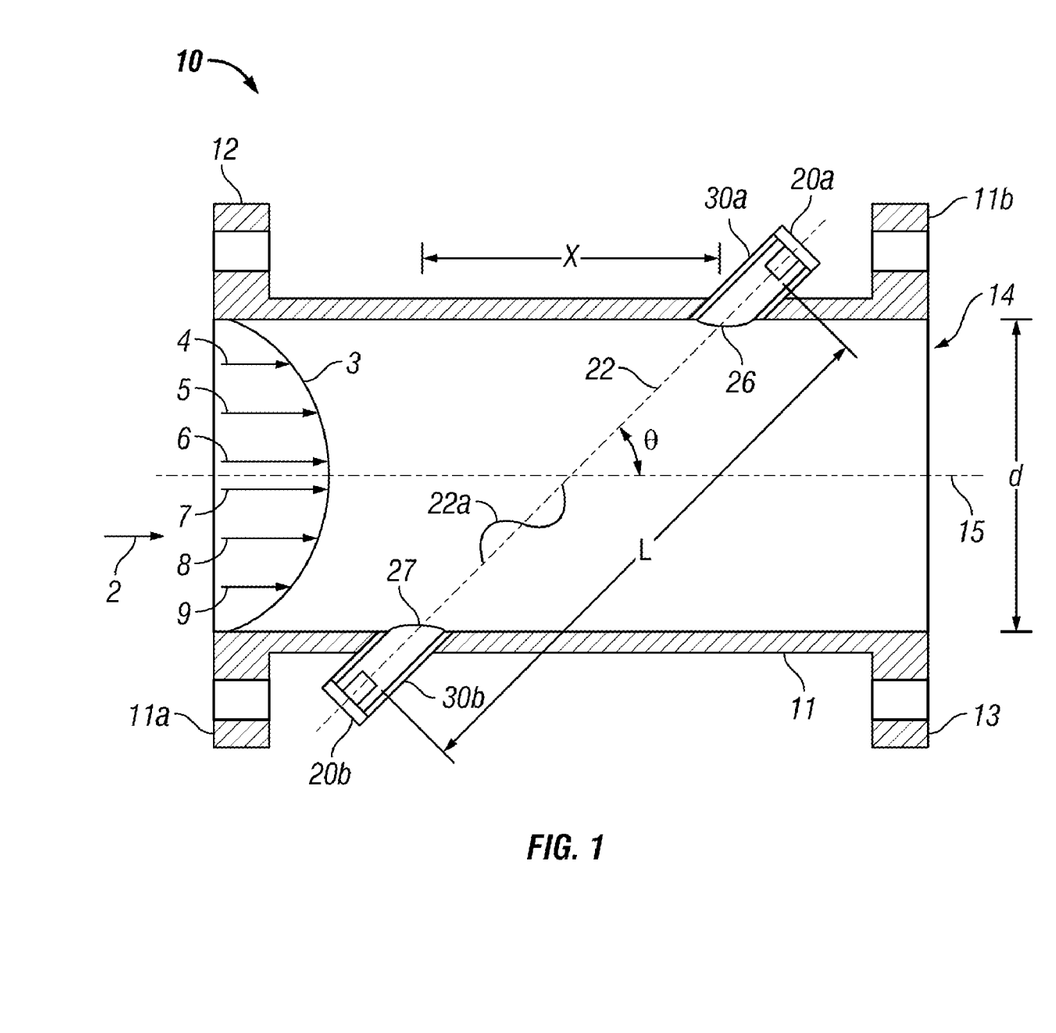
FIG. 1 is a cross-sectional top view of an embodiment of an ultrasonic flow meter.
Figure 2:
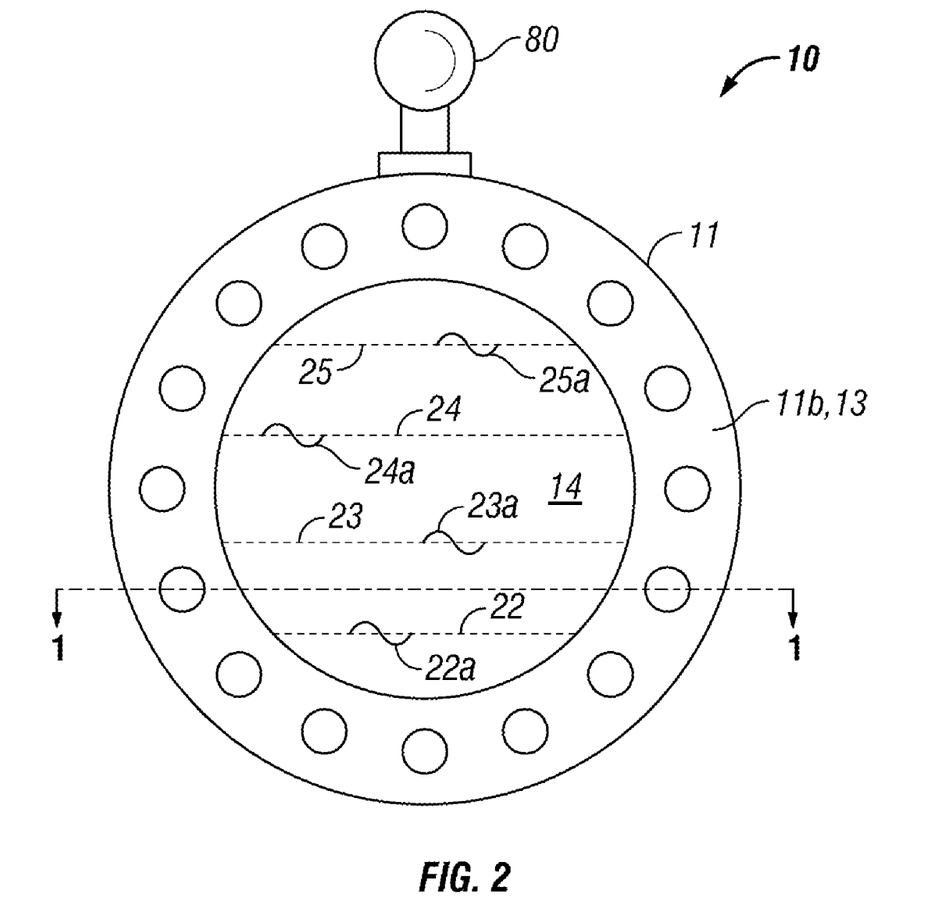
FIG. 2 is a schematic end view of the flow meter of FIG. 1.
Figure 3:
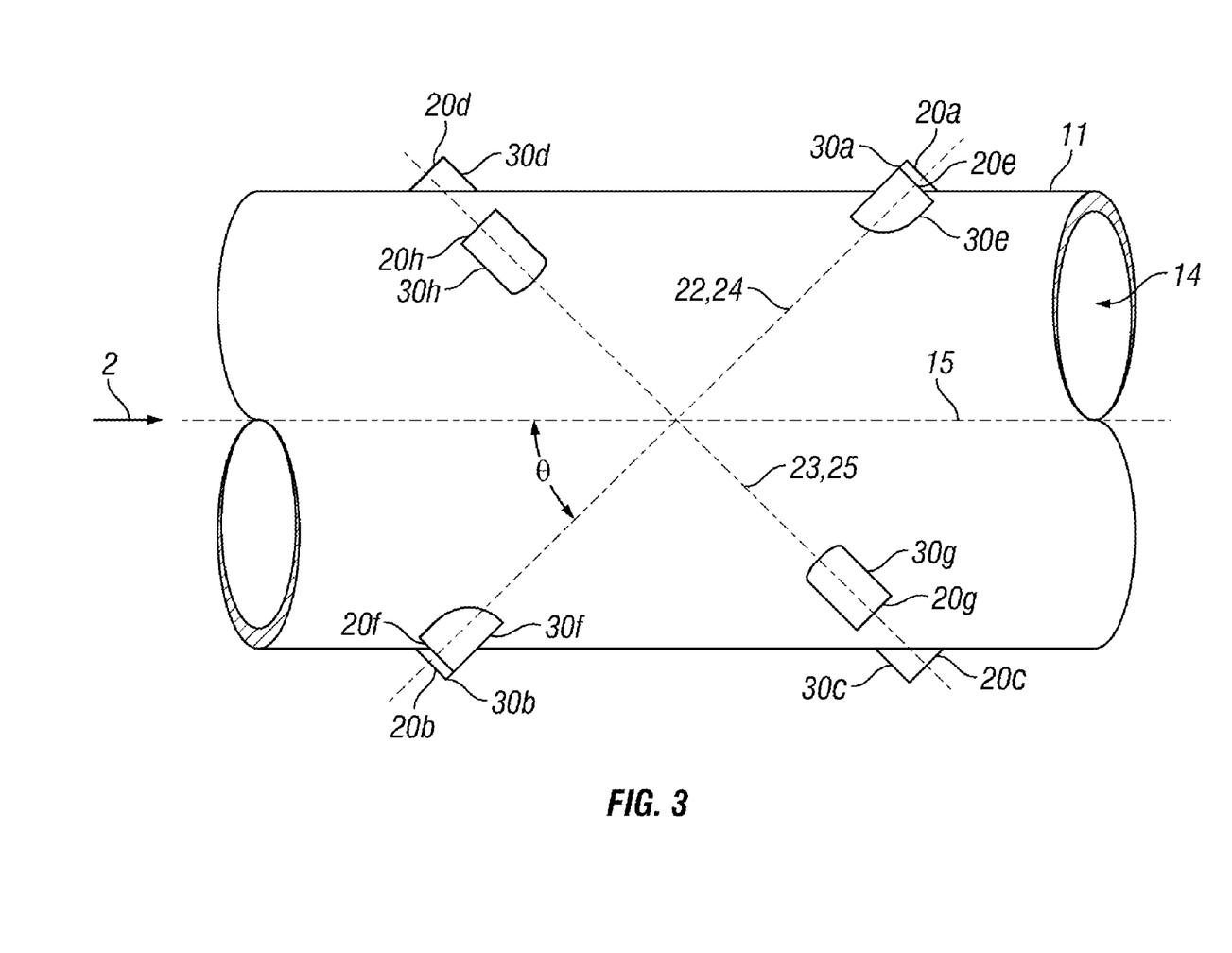
FIG. 3 is a top schematic view of the flow meter of FIG. 1.

Referring now to FIGS. 1-3, schematic views of an embodiment of an ultrasonic flow meter 10 is shown. Meter 10 includes a meter body or spool piece 11 suitable for placement between sections of a pipeline. Spool piece 11 extends along a central axis 15 between a first or upstream end 11a and a second or downstream end 11b opposite first end 11a. As best shown in FIGS. 1 and 2, in this embodiment, each end 11a, b each comprises a mounting flange 12, 13, respectively. In addition, spool piece 11 has a predetermined size and defines a central through passage 14 extending between ends 11a, b and through which a measured fluid (e.g., gas and/or liquid) flows.

As shown in FIGS. 1 and 3, in this embodiment, meter 10 includes four pairs of transducers disposed in transducer ports positioned along the length of spool piece 11—a first pair of transducers 20a, 20b disposed in transducer ports 30a, 30b, respectively, a second pair of transducers 20c, 20d disposed in transducer ports 30c, 30d, respectively, a third pair of transducers 20e, 20f disposed in transducer ports 30e, 30f, and a fourth pair of transducers 20g, 20h disposed in transducer ports 30g, 30h, respectively.

Each transducer (e.g., transducer 20a, 20b, 20c, 20d, 20e, 20f, 20g, 20h) is an acoustic transceiver, and more particularly an ultrasonic transceiver, meaning each generates and receives acoustic energy having frequencies of above about 20 kilohertz. The acoustic energy may be generated and received by a piezoelectric element in each transducer. To generate an acoustic signal, the piezoelectric element is stimulated electrically by way of a sinusoidal signal, and it responds by vibrating. The vibration of the piezoelectric element generates the acoustic signal that travels through the measured fluid to the corresponding transducer of the transducer pair. Similarly, upon being struck by acoustic energy (i.e., the acoustic signal and other noise signals), the receiving piezoelectric element vibrates and generates a sinusoidal electrical signal that is detected, digitized, and analyzed by electronics associated with the meter.

The transducers of each pair of transducers are disposed opposite each other across through passage 14 and communicate acoustic signals back-and-forth to each other. Specifically, transducers 20a, 20b are disposed opposite each other across through passage 14 and communicate acoustic signals back-and-forth to each other; transducers 20c, 20d are disposed opposite each other across through passage 14 and communicate acoustic signals back-and-forth to each other; transducers 20e, 20f are disposed opposite each other across through passage 14 and communicate acoustic signals back-and-forth to each other; and transducers 20g, 20h are disposed opposite each other across through passage 14 and communicate acoustic signals back-and-forth to each other. An acoustic signal path 22, 23, 24, 25, sometimes referred to as a "chord" or "chordal path," exists between each pair of opposed transducers 20a, 20b; 20c, 20d; 20e, 20f; and 20g, 20h, respectively.

Each pair of transducers and associated transducer ports corresponds to a single chordal path. Each chordal path 22, 23, 24, 25 loosely forms the shape of an "X" with respect to a different chordal path 22, 23, 24, 25 in top view. As best shown in FIG. 2, each pair of transducers and its corresponding chordal path 22, 23, 24, 25 is disposed at a different "level" in spool piece 11. Taking FIGS. 2 and 3 together, the pairs of transducers are arranged such that the lower two pairs of transducers 20a, 20b and 20c, 20d corresponding to chords 22 and 23, respectively, form the shape of an "X" in top view, and the upper two pairs of transducers 20e, 20f and 20g, 20h corresponding to chords 24 and 25, respectively, also form the shape of an "X".

Referring now to FIG. 1, the first pair of transducers 20a, 20b will be described in more detail, it being understood that each pair of transducers of flow meter 10 are similarly configured and arranged. Chord 22 is disposed at an acute angle θ relative to centerline 15 in top view. The length of chord 22 is the distance between the faces of corresponding pair of transducers 20a, 20b. As shown in the illustrative pair of transducers 20a, 20b in FIG. 1, points 26 and 27 define the locations where acoustic signals generated by transducers 20a, 20b, respectively, enter and leave fluid flowing through passage 14 of spool piece 11 (i.e., at the intersection of ports 30a, 30b and passage 14 of spool piece 11). The position of transducers 20a, 20b may be defined by the angle θ, by a first length L measured between transducers 20a, 20b, a second length X corresponding to the axial distance between points 26, 27, and a third length "d" corresponding to inner diameter of spool piece 11. In most cases distances d, X and L are precisely determined during fabrication of the meter (e.g., meter 10). Further, the pair of transducers 20a, 20b are usually placed a specific distance from points 26, 27, respectively, regardless of meter size (i.e., spool piece size). A fluid, such as crude oil or natural gas, flows in a direction 2 with a velocity profile 3. Velocity vectors 4-9 illustrate that the gas velocity through spool piece 11 increases toward the centerline 15.

Referring still to the illustrative pair of transducers 20a, 20b shown in FIG. 1, initially, downstream transducer 20a generates an acoustic signal that propagates across the fluid in the spool piece 11, and is then incident upon and detected by upstream transducer 20b. A short time later (e.g., within a few milliseconds), the upstream transducer 20b generates a return acoustic signal that propagates back across the fluid in the spool piece 11, and is then incident upon and detected by the downstream transducer 20a. Thus, the transducers 20a, 20b play "pitch and catch" with acoustic signals 22a along chordal path 22. During operation, this sequence may occur thousands of times per minute. When sound energy travels from first transducer 20a to the second transducer 20b, it travels against the fluid flow (i.e., upstream), and when sound energy travels from the second transducer 20b to the first transducer 20a, it travels with the fluid flow (i.e., downstream).

The time it takes the sound energy to travel from one transducer to the other is termed the "transit time." The transit time of the acoustic signal 22a between transducers 20a, 20b depends in part upon whether the acoustic signal 22a is traveling upstream or downstream with respect to the fluid flow. The transit time for an acoustic signal traveling downstream (i.e., in the same direction as the fluid flow) is less than its transit time when traveling upstream (i.e., against the fluid flow). The upstream and downstream transit times can be used to calculate the average velocity along the signal path, and the speed of sound in the measured fluid. In particular, the difference in upstream and downstream transit times for the chord (e.g., chord 22) is used to determine the mean fluid flow velocity for that chord. Additionally, the average speed of sound for the chord can also be determined from the sum of the upstream and downstream transit times. If the meter contains multiple chords, the mean flow velocity for the meter is obtained by numerically integrating (i.e., taking an appropriately weighted average of) the mean chordal flow velocities. The volumetric flow rate through the meter is then the product of the mean flow velocity for the meter and the cross-sectional area of the meter.

In general, ultrasonic flow meters can have one or more acoustic signal paths. For example, as best shown in FIGS. 2 and 3, in this embodiment, ultrasonic flow meter 10 actually comprises four chordal paths 22, 23, 24, 25 and associated acoustic signals 22a, 23a, 24a, 25a, respectively, at varying levels within the spool piece 11. Each chordal path 22, 23, 24, 25 corresponds to a transducer pair behaving alternately as a transmitter and receiver similar to first transducer pair 20a, 20b previously described. Also shown in FIG. 2 is electronics control package or enclosure 80, which controls acoustic signal generation, and acquires and processes the data from the four chordal paths 22, 23, 24, 25. The flow velocity of the fluid may be determined at each chord 22, 23, 24, 25 to obtain chordal flow velocities, and the chordal flow velocities combined to determine an average flow velocity over the entire pipe. From the average flow velocity, the amount of fluid flowing in the spool piece, and thus the pipeline, may be determined.

Figure 4:
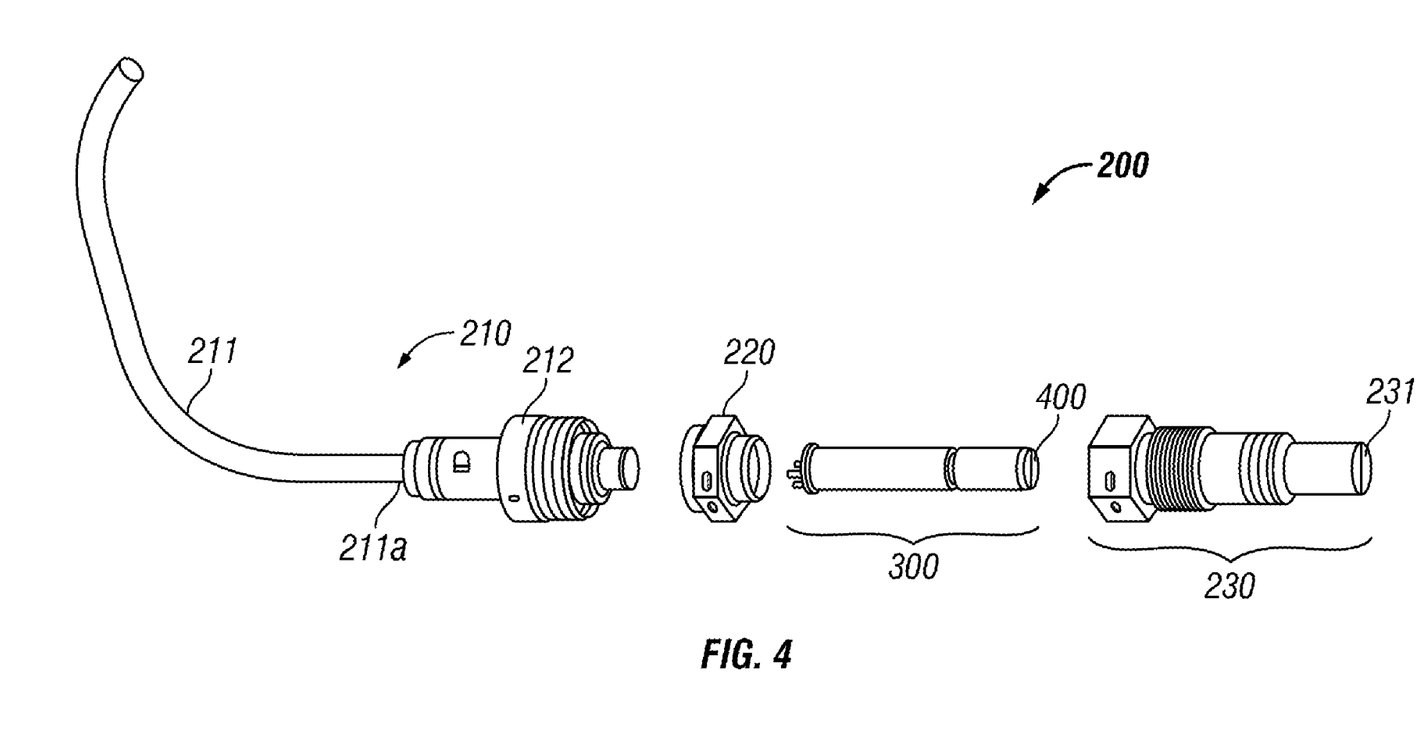
FIG. 4 is an exploded view of an embodiment of an assembly in accordance with the principles described herein.

Referring now to FIG. 4, an embodiment of a transducer assembly 200 for sending and receiving acoustic signals is shown. Transducer assembly 200 is disposed within and coupled to a transducer port of an ultrasonic flow meter (e.g., port 30a of flow meter 10). For example, transducer assembly 200 may be used for any of transducers 20a, 20b, 20c, 20e, 20f, 20g previously described. In this embodiment, transducer assembly 200 comprises a wiring harness 210, a retaining nut 220, a transducer housing 230, and a transducer 300.

Wiring harness 210 comprises a cable 211 and a connector 212. Cable 211 has a first or distal end 211a coupled to electrical connector 212 and a second end (not shown in FIG. 4) coupled to the electronics package of the flow meter. Connector 212 is electrically coupled to transducer 300 through an aperture in retaining nut 220. Together, cable 211 and connector 212 allow communication of electrical signals between transducer 300 and the meter electronics. Wiring harness 210, and in particular connector 212, are coupled to the transducer port (e.g., port 30a) by way of retaining nut 220 and transducer housing 230.

Transducer 300 telescopes axially into transducer housing 230 and is held in place, at least in part, by retaining nut 220. When transducer 300 and transducer housing 230 are engaged, a piezoelectric assembly 400 of transducer 300 acoustically couples to a matching layer 231 coupled to housing 230. Matching layer 231 provides acoustical coupling between the piezoelectric element 410 and fluid flowing through the ultrasonic flow meter.

Figure 5:
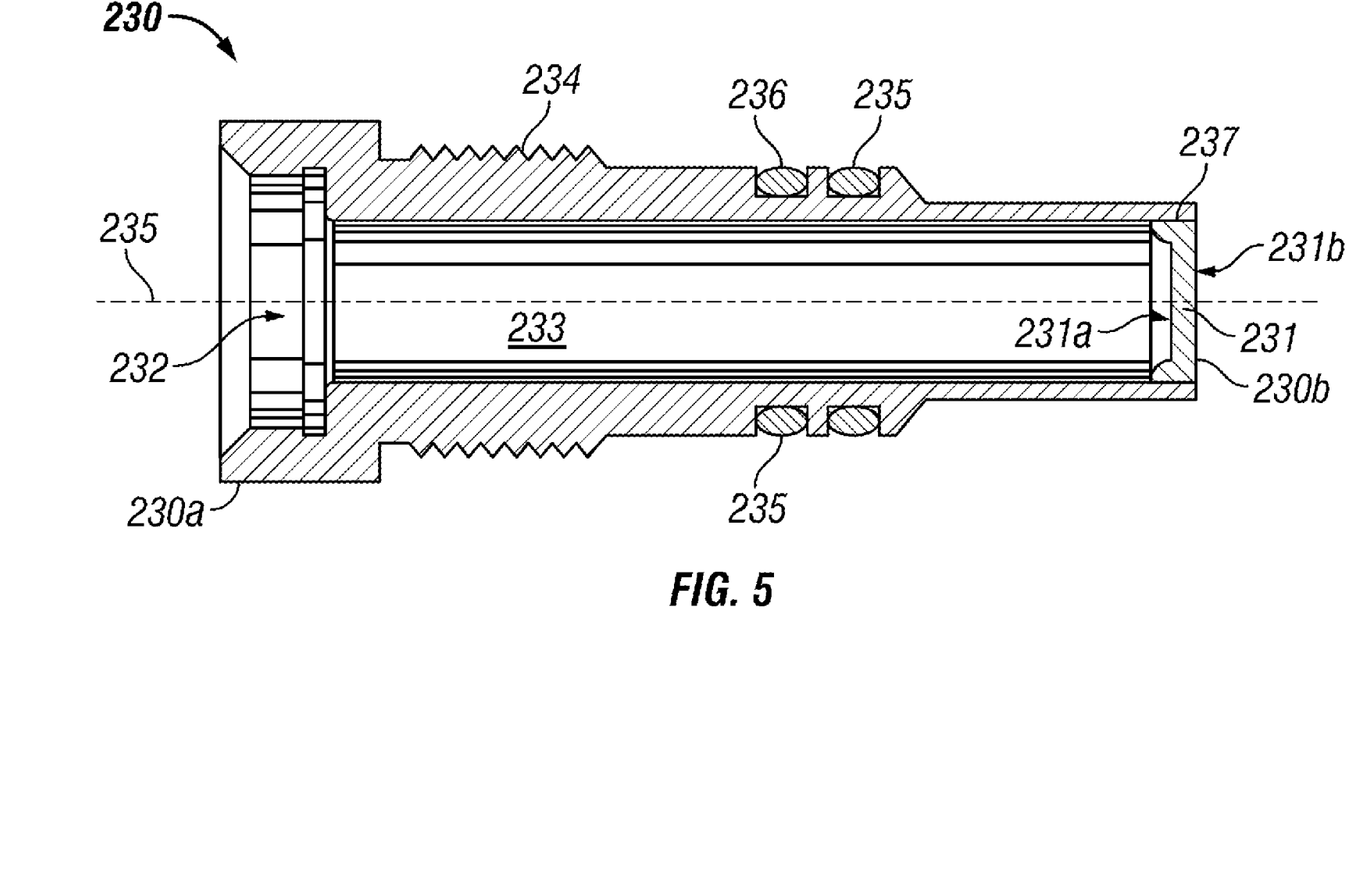
FIG. 5 is a cross-sectional view of a transducer housing of FIG. 4.

Referring now to FIG. 5, a cross-sectional view of transducer housing 230 is shown. Housing 230 is generally cylindrical and extends along a central or longitudinal axis 235 from a first or open end 230a to a second or closed end 230b. In addition, housing 230 includes a throughbore 232 extending between ends 230a, b. Acoustic matching layer 231 is disposed in throughbore 232 at second end 230b and occludes end 230b. In this embodiment, an annular seal 237 is formed between matching layer 231 and housing 230. Thus, throughbore 232 defines an inner chamber or volume 233 within housing 230 that extends axially from open end 230a to matching layer 231. Matching layer 231 has an interior side or inner surface 231a facing chamber 233 and an exterior side or outer surface 231b exposed to the fluids flowing through the flow meter.

Housing 230 also includes radially outer or external threads 234 and a pair of annular seals 235, each seal 235 being disposed in an annular groove or recess 236 in the radially outer surface of housing 230. Threads 234 allow housing 230 to threadingly engage the transducer port in the spoolpiece. Once disposed in the transducer port, seals 235 are radially positioned between housing 230 and the spoolpiece, and further, sealingly engage housing 230 and the spoolpiece, thereby restricting and/or preventing fluid from flowing axially between housing 230 and the spoolpiece. Although housing 230 has been described as being threadingly coupled to the transducer port, in general, any suitable means may be used to couple the transducer housing (e.g., housing 230) to the spoolpiece including, without limitation, a welded connection.

Referring to FIGS. 4 and 5, transducer 300 is inserted into open end 230a and axially advanced through inner chamber 233 and throughbore 232 until a piezoelectric assembly 400 abuts inner surface 231a of acoustic matching layer 231. To provide good acoustic coupling, inner surface 231a and outer surface 231b of acoustic matching layer 231 are substantially flat and substantially parallel to one another. In some embodiments, surfaces 231a, b are flat to within 0.001 inch or better and parallel to within 0.003 inches or better. Additionally, transducer 300 is coaxially positioned in housing 230 such that piezoelectric element 410 is radially centered against acoustic matching layer 231. Acoustic matching layer 231 has an axial thickness (measured parallel to axis 235 of housing 230) that in some embodiments is substantially equal to an odd multiple of one-quarter ($1/4$, $3/4$, $5/4$, $7/4$, etc.) wavelength of the sound within the matching layer at the frequency of operation of the transducer.

Figure 6:
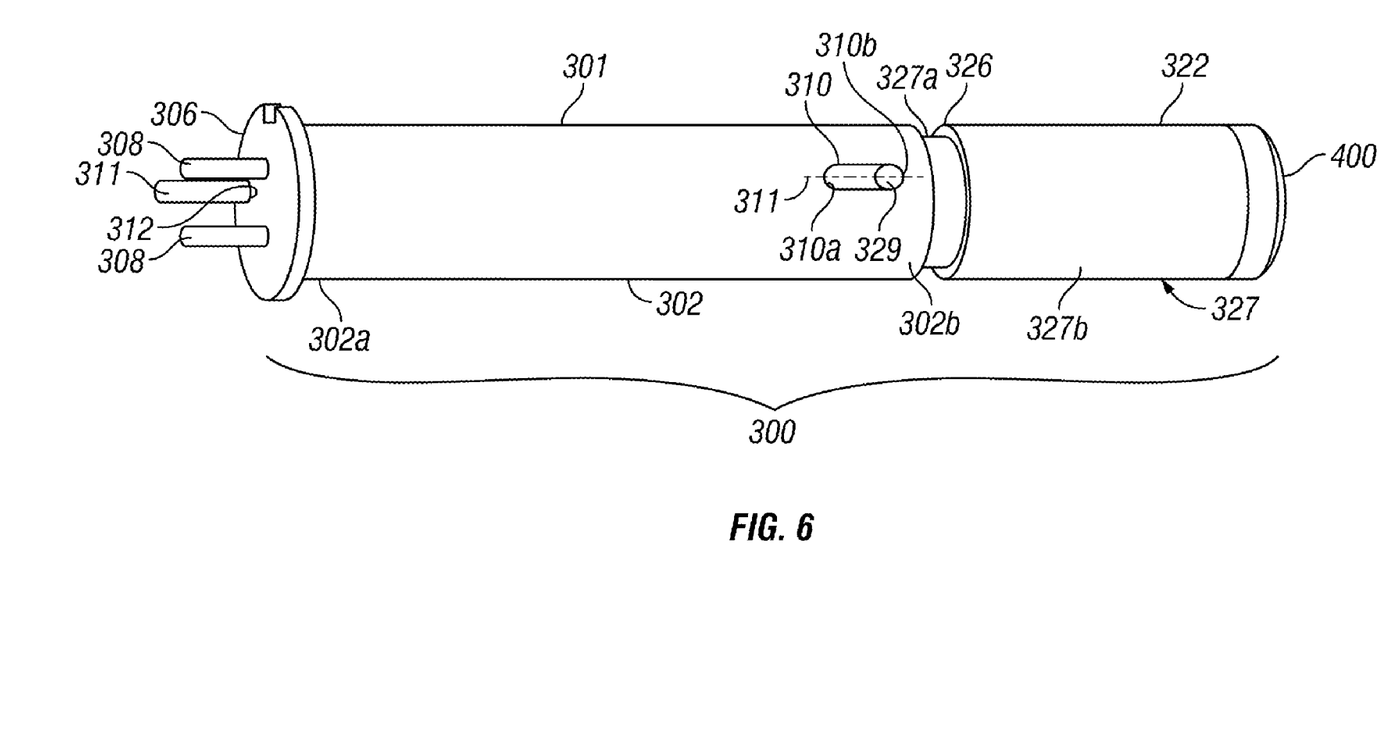
FIG. 6 is an enlarged perspective view of the transducer assembly of FIG. 4.
Figure 7:
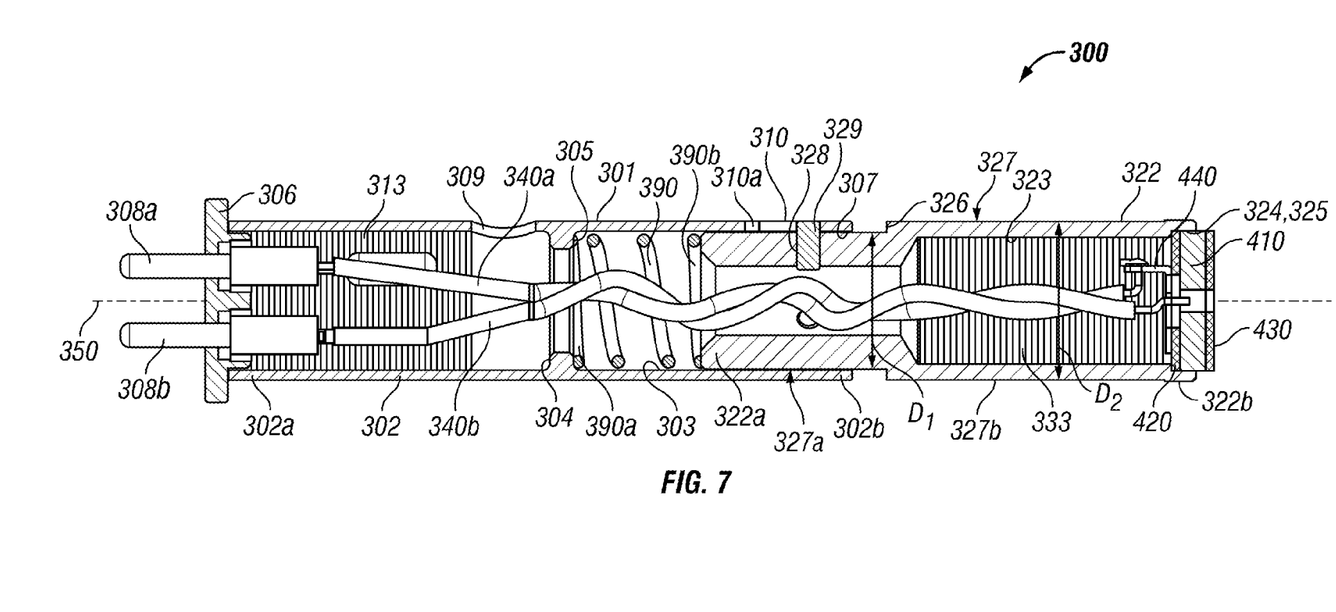
FIG. 7 is a cross-sectional view of the transducer assembly of FIG. 4.

Referring now to FIGS. 6 and 7, transducer 300 has a central or longitudinal axis 350 and comprises an outer housing 301, a pair of insulated wires 340a, b, a spring 390, and piezoelectric assembly 400. As previously described, transducer 300 is coaxially disposed within transducer housing 230 and functions to receive and transmit acoustic signals used to estimate the volumetric flow rate of a fluid flowing through an ultrasonic meter.

Elongated housing 301 is generally cylindrical has a central axis coincident with axis 350. In this embodiment, housing 301 comprises two parts—a generally cylindrical transducer case 302 and a generally cylindrical crystal holder 322 coupled to case 302. Holder 322 and case 302 each have a central axis coincident with axis 350. In other words, holder 322 and case 302 are coaxially aligned.

Case 302 extends axially along axis 350 from a first end 302a to a second end 302b, and includes a throughbore 303 extending between ends 302a, b and an annular flange or rib 304 extending radially inward into throughbore 303. Annular flange 304 defines a seat 305 that engages one end of spring 340, which extends axially into throughbore 303. Throughbore 303 is closed off at end 302a by an end cap 306, however, end 302b defines an opening 307 that receives holder 322. End cap 306 holds a pair of male electrical terminals 308a, b that extend axially from end 302a through end cap 306. Consequently, end cap 306 may also be referred to as terminal holder 306. Terminal 308a is electrically coupled to wire 340a, and terminal 308b is electrically coupled to wire 340b.

A fill material 313 fills a portion of throughbore 303 proximal end 302a and surrounds wires 308a, b. Fill material 313 preferably creates an adhesive bond with end cap 306, the portion of terminals 308a, b extending into throughbore 303, the radially inner surface of case 302, and wires 308a, b to rigidly hold each of these components in place relative to each other. In general, the fill material (e.g., fill material 313) may comprise any suitable material such as plastic or epoxy. In this embodiment, fill material 313 is an epoxy that is injected into throughbore 303 through an access hole or port 309 in a flowable, liquid form and then cures and hardens into a rigid solid. Access hole 309 extends radially through case 302 from throughbore 303 to the radially outer surface of case 302.

Referring still to FIGS. 6 and 7, case 302 also includes an elongate through slot 310 extending radially through case 302 from throughbore 303 to the radially outer surface of case 302. Elongated slot 310 extends along a central axis 311 from a first end 310a to a second end 310b. Axis 311 is parallel to axis 350. In this embodiment, case 302 also includes connection key 311, which helps ensure transducer assembly 200 is properly oriented for coupling with connector 212. Terminal holder 306 may comprise a slot 312 that receives and engages connection key 311, thereby preventing rotation of terminal holder 306 relative to connector 212.

Referring still to FIGS. 6 and 7, crystal holder 322 extends along axis 350 between a first end 322a disposed in throughbore 303 of holder 302 and a second end 322b distal holder 302. Thus, holder 322 is partially disposed in throughbore 303 of case 302 and extends axially from opening 307 in end 302b of case 302. Holder 322 also includes a throughbore 323 extends axially through holder 322 between ends 322a,b. At end 322b, holder 322 includes a counterbore 324 defining an annular recess 325 that extends axially along the radially inner surface of holder 322 from end 322b.

The radially outer surface of holder 322 includes an annular shoulder 326 defining a transition in the outer diameter of holder 322. In particular, the outer surface 327 of holder 322 includes a first section 327a extending axially from end 322a to shoulder 326 and having a first outer diameter $D_1$, and a second section 327b extending axially from shoulder 326 toward end 322b and having a second outer diameter $D_2$ that is greater than first diameter $D_1$. In this embodiment, first outer diameter $D_1$ is substantially the same or slightly less than the inner diameter of throughbore 307 at end 302b such that end 322a may be slidingly received by throughbore 307. However, second outer diameter $D_2$ is substantially the same as the outer diameter of case 302 such that shoulder 326 abuts end 302b of case 302 when holder 322 is sufficiently advanced into throughbore 307, thereby preventing further axial advancement of end 322a into throughbore 307.

Referring still to FIGS. 6 and 7, holder 322 also includes an aperture 328 extending radially through holder 322 from first section 327a of outer surface 327 to throughbore 323. A pin 329 is disposed in aperture 328 and extends through elongated slot 310 in case 302. Pin 329 is fixed to holder 322 within aperture 328 such that pin 329 does not move translationally or rotationally relative to aperture 328 or holder 322. However, pin 329 slidingly engages slot 310. In particular, pin 329 has a diameter that substantially the same or slightly less than the width of slot 310 (measured perpendicular to axis 311). Consequently, pin 329 restricts and/or prevents case 302 from rotating about axis 350 relative to holder 322, but allows case 302 to move axially relative to holder 322. The relative axial movement between case 302 and holder 322 is limited by engagement of pin 329 with ends 310a, b of slot 310.

Spring 390 is coaxially disposed within throughbore 303 of case 302 and extends axially along axis 350 between a first end 390a and a second end 390b. First end 390a abuts seat 305 of case 302 and second end 390b abuts end 322a of holder 322 extending into throughbore 303. Spring 390, case 302, and holder 322 are sized and configured such that spring 390 is placed in compression when it is disposed in throughbore 303 between seat 305 and end 322a. However, the compression of spring 390 is limited by engagement of shoulder 326 and end 302b. In this manner, shoulder 326 acts as a stop to prevent further insertion of holder 322 into case 302. In addition, engagement of pin 329 and end 310b of slot 310 prevents holder 322 from exiting throughbore 303 and disengaging case 302.

Piezoelectric assembly 400 is axially coupled to holder 322 at end 322b. In particular, piezoelectric assembly 400 is received by counterbore 324 and is seated in annular recess 325. In addition, piezoelectric assembly 400 extends across throughbore 323 at end 322b, thereby occluding end 322b. As will be described in more detail below, wires 340a, b are coupled to piezoelectric assembly 400. It should be appreciated that some slack is provided in wires 340a, b extending from terminals 308a, b, respectively, to piezoelectric assembly 400 to account for the axial movement of holder 322 relative to case 302.

A fill material 333 fills a portion of throughbore 323 proximal end 322b and surrounds wires 308a, b. Fill material 333 preferably creates an adhesive bond with piezoelectric assembly 400, the radially inner surface of holder 322, and wires 308a, b to rigidly hold each of these components in place relative to each other. In general, the fill material (e.g., fill material 333) may comprise any suitable material such as plastic or epoxy. In this embodiment, fill material 333 is the same as fill material 313 previously described. Namely, fill material 333 is an epoxy that is injected into throughbore 323 in a flowable, liquid form and then cures and hardens into a rigid solid.

Figure 8:
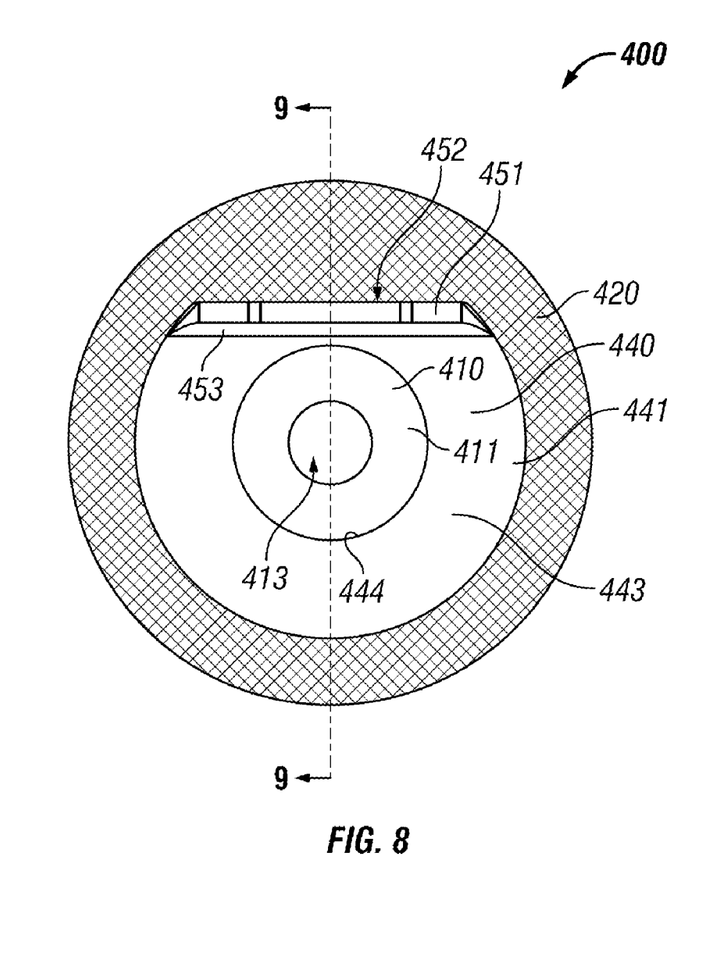
FIG. 8 is front view of the piezoelectric assembly of FIG. 7.
Figure 9:
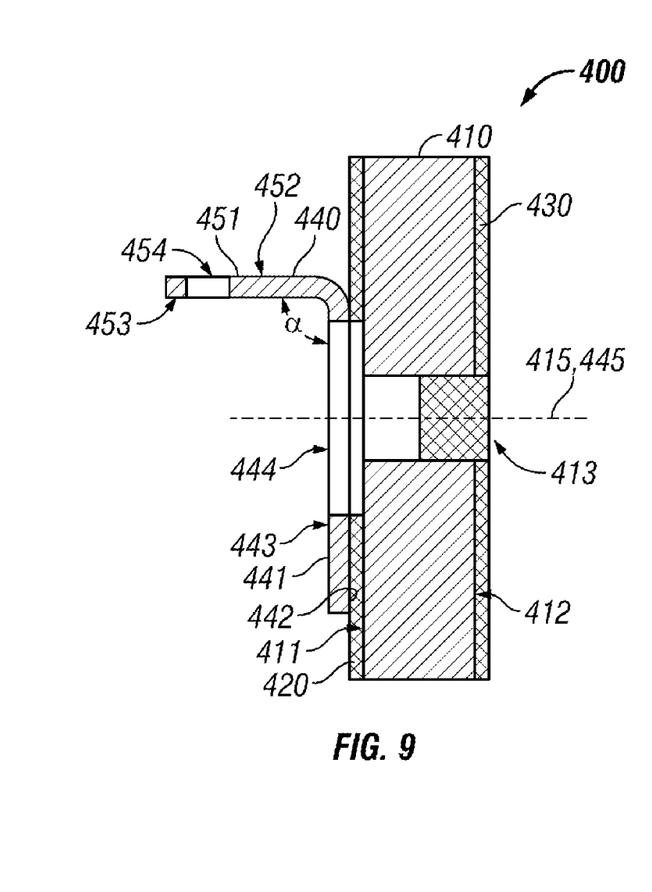
FIG. 9 is a cross-sectional view of the piezoelectric assembly of FIG. 8 taken along line 9-9.

Referring now to FIGS. 7-9, piezoelectric assembly 400 includes piezoelectric element 410, a positive electrode 420, a negative electrode 430, and a shim connector 440. Piezoelectric element 410 is generally cylindrical and disk-shaped, and extends along a central axis 415 between a first or inner face 411 and a second our outer face 412 opposite inner face 411. A central throughbore 413 coaxially aligned with axis 415 extends axially through piezoelectric element 410 from face 411 to face 412 Inner face 411 generally faces throughbore 323 of holder 322, and outer face 412 generally faces away from throughbore 323. In this embodiment, faces 411, 412 are planar and parallel to each other. In general, piezoelectric element 410 may comprise any suitable piezoelectric material including, without limitation, lead zirconate titanate (PZT). Piezoelectric assembly 400 is coaxially coupled to holder 322 such that axis 415 is coincident with axis 350.

As best shown on FIGS. 8 and 9, positive electrode 420 is disposed on face 411 and a negative electrode 430 is disposed on face 412. In this embodiment, positive electrode 420 does not extend into throughbore 413, however, negative electrode 430 extends along face 412 and, at least partially, into throughbore 413. Each electrode 420, 430 comprises a relatively thin layer of a conductive material such as silver or nickel that is sprayed or otherwise deposited on faces 411, 412, respectively. The axial thickness of each electrode 420, 430 measured parallel to axis 415 is preferably less than 0.001 inch.

Without being limited by this or any particular theory, when a time-varying voltage is applied between electrodes (e.g., electrodes 420, 430), an electric field is induced in the piezoelectric crystal or element (e.g., piezoelectric element 410) that causes the piezoelectric element to vibrate and emit acoustic energy. Further, acoustic energy incident on the piezoelectric element causes the piezoelectric element to vibrate and generate a voltage between the electrodes.

Figure 10:
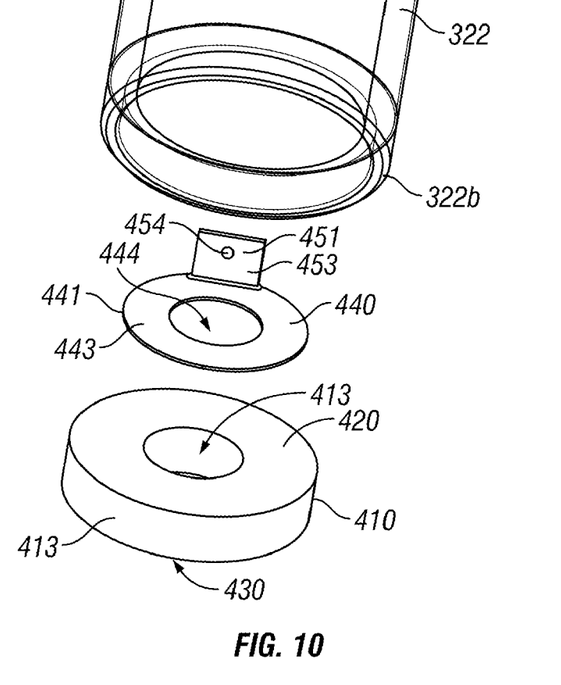
FIG. 10 is a partial exploded view of the crystal holder and piezoelectric assembly of FIG. 7.

Referring now to FIGS. 8-10, shim connector 440 includes a thin, disk-shaped base 441 disposed along electrode 410 and an extension or tab 451 extending away from base 441 and face 411 at an angle $\alpha$. In general, angle $\alpha$ may be any suitable angle and is preferably between 45° and 135°. In this embodiment, angle $\alpha$ is 90°, and thus, tab 451 extends perpendicularly from base 441, face 411 and piezoelectric element 410 into throughbore 323 (FIG. 7). In this embodiment, base 441 and tab 451 are integral and monolithic.

Base 441 includes a first face 442 that engages positive electrode 420, a second face 443 opposite first face 442 and facing away from positive electrode 420, and an aperture 444 extending through base 441 from face 442 to face 443. Aperture 444 has a central axis 445 that is coaxially aligned with axes 415, 350. In this embodiment, faces 442, 443 are planar and parallel to each other.

Base 441 is attached to positive electrode 420 along face 442. In general, any suitable means allows for communication of electric signals may be used to attached base 441 to electrode 420. For example, base 441 may be attached to electrode 420 with a conductive material such as solder or a conductive epoxy. To reduce the likelihood of failure of the joint between base 441 and electrode 420 due to stresses arising between base 441 and electrode 420, the surface area of base 441 and shim connector 440 attached to electrode 420 is preferably relatively large. For example, in this embodiment, shim connector 440 is attached to electrode 420 along the entire face 442. The degree or amount of attachment surface area between the shim connector (e.g., shim connector 440) and the electrode to which the shim connector is directly attached (e.g., electrode 420) may be quantified by an "attachment surface area ratio" equal to the ratio of surface area of the shim connector directly attached to the electrode to the total surface area of the face of the piezoelectric element to which the electrode and the shim connector are attached (e.g., total surface area of face 411 of piezoelectric element 410). The attachment surface area ratio for embodiments described herein is preferably between 0.25 and 1.00, and more preferably between 0.50 and 1.00. In the embodiment shown in FIGS. 8 and 9, the attachment surface area ratio is about 0.50.

As best shown in FIGS. 9 and 10, tab 451 extends from an outer edge or periphery of base 441. Tab 451 includes a first face 452 generally extending from and contiguous with first face 442, a second face 453 generally extending from and contiguous with second face 443, and a wire attachment receptacle 454. In this embodiment, wire attachment receptacle 454 is an aperture extending through tab 451 from face 452 to face 453. Further, in this embodiment, faces 452, 453 are planar and parallel to each other.

In general, shim connector 440 may comprise any suitable material capable of communicating an electrical signal. However, shim connector 440 preferably comprises a material exhibiting a coefficients of thermal expansion (CTE) similar to the CTE of PZT (i.e., about 3.6 ppm/° C.). In particular, shim connector 440 preferably comprises a material having a CTE between −1 and 9 ppm/° C., and more preferably between 1 and 6 ppm/° C. Examples of suitable materials for shim connector 440 include, without limitation, Invar, Fe64/Ni36, FeNi36, UNS K93603, ASTM B753 T36, and UNS K94610.

Referring now to FIGS. 7-9, shim connector 440 provides an electrical connection between wire 340a extending from terminal 308a and positive electrode 420. In particular, wire 340a is attached to tab 451, which is electrically coupled to positive electrode 420. In general, wire 340a may be attached to tab 451 by any suitable means that allows the conduction of an electrical signal including, without limitation, solder or a conductive epoxy. In this embodiment, wire 340a is positioned through wire attachment receptacle 454, bent back over tab 451, and held in place by solder. Further, wire 340b extending from terminal 308b extends through aperture 444 into throughbore 413 of piezoelectric element 410, and is attached to the portion of negative electrode 430 extending into throughbore 413. In general, wire 340b may be attached to negative electrode 430 by any suitable means that allows the conduction of an electrical signal including, without limitation, solder or a conductive epoxy. In this embodiment, wire 340b attached to negative electrode 430 within throughbore 413 by conductive epoxy that fills throughbore 413 and surrounds wire 340b within throughbore 413. The conductive epoxy disposed in throughbore 413 maintains the position of wire 308b in throughbore 413 and electrically couples wire 308b to the portion of negative electrode 430 extending into throughbore 413.

Figure 11:
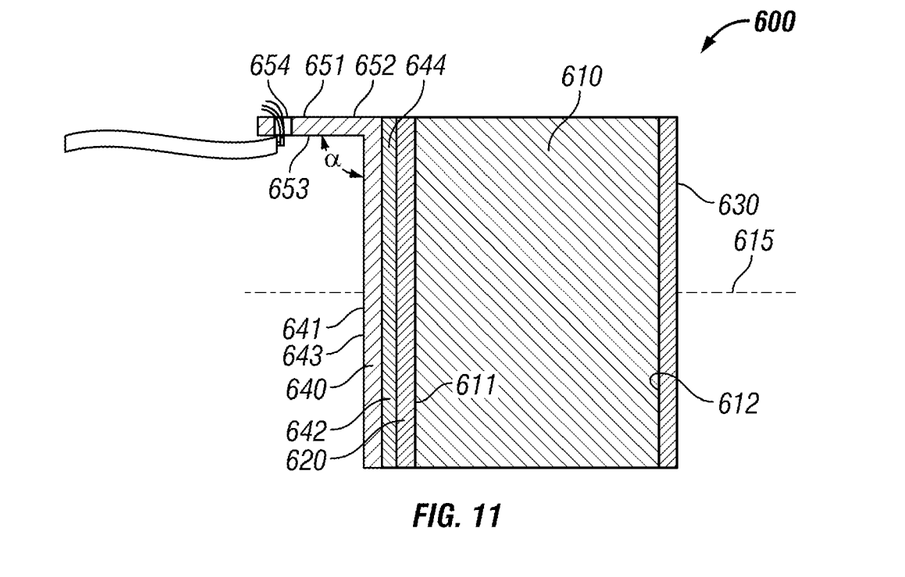
FIG. 11 is a partial cross-section view of an embodiment of a piezoelectric assembly.

Referring now to FIG. 11, a cross-sectional view of an alternative embodiment of a piezoelectric assembly 600 is shown. Piezoelectric assembly 600 is similar to piezoelectric assembly 400 previously described. Namely, piezoelectric assembly 600 includes a piezoelectric element 610, a positive electrode 620, a negative electrode 630, and a shim connector 640. Piezoelectric element 610 is the same as piezoelectric element 410 previously described, except that piezoelectric element 610 does not include a throughbore (e.g., throughbore 413). Thus, piezoelectric element 610 is generally cylindrical and disk-shaped, and extends along a central axis 615 between a planar first face 611 and a planar second face 612 opposite face 611 and parallel to face 611.

Electrodes 620, 630 are substantially the same as electrodes 420, 430 previously described. Positive electrode 620 is disposed on face 611 and a negative electrode 630 is disposed on face 412. However, since piezoelectric element 610 does not include a throughbore, neither electrode 620 nor electrode 630 extends in a throughbore.

Shim connector 640 is substantially the same as shim connector 440. Namely, shim connector 640 includes a thin, disk-shaped base 641 disposed along electrode 610 and a monolithic extension or tab 651 extending away from base 641 and face 611 at an angle α. Angle α is preferably between 45° and 135°. Base 641 includes a first face 642 attached to positive electrode 620 with a conductive material 644 (e.g., conductive epoxy), a second face 643 opposite first face 642, however, base 641 does not include any aperture or throughbore. Base 641 is attached to positive electrode 620 along face 642. Tab 651 extends from an outer edge or periphery of base 641 and includes a first face 652 generally extending from and contiguous with first face 642, a second face 653 generally extending from and contiguous with second face 643, and a wire attachment receptacle 654.

Although one shim connector 640 is shown attached one electrode (i.e., electrode 620), a second shim connector (e.g., shim connector 640) could be attached to the second electrode (e.g., electrode 630). In this embodiment, face 642 is attached to and extends across the entire electrode 620 and the entire face 611 of piezoelectric element 610. Accordingly, in this embodiment, the attachment surface area ratio is 1.0. Since the electrical connection between shim connector 640 and electrode 620 is made over the entire surface area of face 611 and the entire surface area of electrode 620 opposite piezoelectric element and perpendicular to axis 615, any stresses in the connection between electrode 620 and shim connector 640 are spread out over the whole area of the electrode 620 instead of being concentrated in a small area.

The entire assembly shown in FIG. 11 can be encapsulated in a rigid epoxy. Any stresses caused by mismatches in the CTEs of piezoelectric element 610 and epoxy are then spread out over the entire area of contact between the electrode and shim thereby minimizing the risk of failure of the electrical connection.

As previously described, embodiments described herein utilize a shim connector (e.g., shim connector 440) to electrically couple a wire (e.g., wire 340a) to an electrode (e.g., electrode 420). By utilizing the shim connector, as opposed to directly attaching the wire to the electrode, embodiments described herein offer the potential to enhance the surface area of attachment with the piezoelectric element, and reduce the likelihood of failure of the attachment due to stresses arising between the piezoelectric element and the attachment to the piezoelectric element. Specifically, by increasing the attachment surface area according to the preferred attachment surface area ratios, embodiments described herein allow for distribution of the stresses over a greater surface area, thereby offering the potential for a more robust electrical connection that is less susceptible to failure.

The bent geometry of the shim connector (e.g., shim connector 440) and the angle (e.g., angle α) between the base (e.g., base 441) and the tab (e.g., tab 451) of the shim connector offers the potential to relieve stress on the electrical connection between the shim connector and the electrode (e.g., electrode 420) due to movement of the wire (e.g., wire 340a) attached to the tab. For example, the wire may be moved by thermal expansion of the epoxy surrounding the wire or a person tugging on the wire. However, when the wire is moved up or down within the holder (e.g., holder 322) or radially inward or outward within the holder, the tab can flex without causing significant stress on the connection between the base of the shim connector and electrode, thereby reduce the risk of failure of this connection.

In the embodiments described herein, the shim connector (e.g., shim connector 440) preferably comprises a material having a coefficient of thermal expansion similar to that of the piezoelectric element (e.g., piezoelectric element 400). By closely matching the CTE of the shim connector with the CTE of the piezoelectric element, embodiments described herein offer the potential to reduce stresses on the electrode and within the conductive epoxy during temperature changes, thereby minimizing the risk of failure.

In the embodiments described herein, the axial thickness of both the shim connector (e.g., the axial thickness of base 441 of shim connector 440) and conductive material attaching the shim connector to the positive electrode (e.g., the conductive epoxy bonding shim connector 440 to positive electrode 420), measured parallel to the central axis of the transducer (measured parallel to axes 350, 415, 445), is preferably small compared to the axial thickness of the piezoelectric element (e.g., piezoelectric element 410). Further, the mass of the shim connector and the conductive material are preferably substantially less than the mass of the piezoelectric element. If the mass of the shim connector and conductive material is much less than the mass of the piezoelectric crystal, the presence of the shim connector and conductive material are less likely to cause an appreciable shift in the resonant frequencies of the piezoelectric element. Additionally, if the shim connector and conductive epoxy are very thin relative the piezoelectric element, the shim connector and conductive material will be nearly acoustically transparent so that sound energy generated by the piezoelectric element can pass through the shim connector and conductive material with minimal absorption or reflection. For example, for a piezoelectric element operating at 1 MHz and having an axial thickness of 0.080 inch, the axial thicknesses of the shim connector and conductive material are preferably 0.005 inch or less.

The axial thickness of the shim connector (e.g., axial thickness of shim connector 440 measured parallel to axis 415) is preferably small compared to the wavelength of sound in the shim connector material at the frequency of operation of the transducer (e.g., transducer 300). In particular, the axial thickness of the shim connector is preferably less than or equal to 1/20 the wavelength of sound in the shim connector material at the frequency of operation of the transducer as follows:

$$\text{Axial thickness} \leq \frac{\lambda(f)}{20};$$

where $\lambda(f)$ is the wavelength of sound in the shim connector as a function of the frequency (f) of operation of the transducer.

The wavelength of sound in the shim connector material as a function of the frequency (f) of operation of the transducer is equal to the velocity of sound in the shim connector divided by the frequency of operation of the transducer as follows:

$$\lambda(f) = \frac{v}{f};$$

where, $\lambda(f)$ is the wavelength of sound in the shim connector as a function of the frequency (f) of operation of the transducer;

f is the frequency of operation of the transducer; and v is the velocity of sound in the shim connector material.

For example, if the speed of sound in the shim connector material is 5,000 m/s and the frequency of operation is 1 MHz, the axial thickness of the shim material is preferably 0.00025 m (~0.010 in.) or less.

In the manner described, embodiments described herein offer the potential for a more robust electrical connection to a piezoelectric element used in a transducer of an ultrasonic flow meter. The potential advantages of the embodiments described herein may particularly beneficial when the transducer and piezoelectric assembly are subjected to substantial physical stress such as that encountered when required to operate over a large temperature range or subjected to thermal or mechanical shock.

While preferred embodiments have been shown and described, modifications thereof can be made by one skilled in the art without departing from the scope or teachings herein. The embodiments described herein are exemplary only and are not limiting. Many variations and modifications of the systems, apparatus, and processes described herein are possible and are within the scope of the invention. For example, the relative dimensions of various parts, the materials from which the various parts are made, and other parameters can be varied. Accordingly, the scope of protection is not limited to the embodiments described herein, but is only limited by the claims that follow, the scope of which shall include all equivalents of the subject matter of the claims.

What is claimed is:

1. A piezoelectric assembly for an ultrasonic flow meter, comprising:

a piezoelectric element including a first face and a second face;

a first electrode engaging the first face;

a second electrode engaging the second face;

an electrically conductive shim connector attached to the first electrode; and a first wire electrically coupled to the shim connector;

wherein the conductive shim comprises a base attached to the first electrode and a tab extending away from the first electrode and the first face;

wherein the tab comprises an aperture extending through the tab, and wherein an end of the wire extends through the aperture.

2. The assembly of claim 1, wherein the tab is oriented at an angle α relative to the base, wherein the angle α is between 45° and 135°.

3. The assembly of claim 1, wherein the first face of the piezoelectric element is planar and the base includes a planar interface surface that faces the first face of the piezoelectric element and is directly attached to the first electrode.

4. The assembly of claim 3, wherein the interface surface of the base has a total surface area, the first face of the piezoelectric element has a total surface area, and the ratio of the total surface area of the interface surface of the base to the total surface area of the first face of the piezoelectric element is between 0.25 and 1.00.

5. The assembly of claim 4, wherein the ratio of the total surface area of the interface surface of the base to the total surface area of the first face of the piezoelectric element is between 0.50 and 1.00.

6. The assembly of claim 4, wherein the interface surface of the base is directly attached to the first electrode with a conductive material selected from the group consisting of a conductive epoxy or conductive solder.

7. The assembly of claim 1, wherein the shim connector comprises a conductive material having a coefficient of thermal expansion between −1 and 9 ppm/° C.

8. The assembly of claim 1, wherein the conductive material of the shim connector has a coefficient of thermal expansion between 1 and 6 ppm/° C.

9. The assembly of claim 1, wherein the piezoelectric element includes a throughbore extending axially between the first face and the second face, wherein the second electrode extends along the second face of the piezoelectric element and at least partially into the throughbore of the piezoelectric element.

10. The assembly of claim 9, further comprising a second wire having an end disposed in the throughbore of the piezoelectric element and electrically coupled to the second electrode.

11. The assembly of claim 10, wherein the base of the shim connector includes a throughbore, and wherein the wire extends through the throughbore of the base and into the throughbore of the piezoelectric element.

12. The assembly of claim 10, wherein the end of the second wire disposed in the throughbore of the piezoelectric element is electrically coupled to the second electrode with a conductive material selected from the group consisting of a conductive epoxy and conductive solder.

13. An ultrasonic flow meter for measuring the flow of a fluid through a pipeline, comprising:
a spool piece including a throughbore and a transducer port extending from the outer surface of the spool piece to the throughbore;
a transducer assembly disposed in the transducer port, wherein the transducer assembly comprises:
a case having a central axis, a first end, and a second end opposite the first end, wherein the case includes a throughbore extending axially between the first end and the second end, and wherein the second end comprises an opening to the throughbore of the case;
a crystal holder at least partially disposed in the throughbore of the case and extending axially from through the opening, wherein the crystal holder is coaxially aligned with the case and has a first end disposed in the throughbore of the case and a second end distal the case;
a piezoelectric assembly coupled to the second end of the crystal holder, wherein the piezoelectric assembly includes:
a piezoelectric element extending along a central axis from a first face distal the throughbore of the spool piece to a second face proximal the throughbore of the spool piece;
a first electrode disposed on the first face;
a second electrode disposed on the second face;
a shim connector attached to the first electrode;
a first wire electrically coupled to the shim connector and the first electrode; and
a second wire electrically coupled to the second electrode.

14. The assembly of claim 13, wherein the shim comprises a base attached to the first electrode and a tab oriented at an angle α relative to the base, wherein the angle α is between 45° and 135°.

15. The assembly of claim 14, wherein the base and the tab are monolithic.

16. The assembly of claim 14, wherein the first wire is directly attached to the tab.

17. The assembly of claim 14, wherein the first face and the second face of the piezoelectric element are planar and parallel, and wherein an interface surface of the base directly attached to the first electrode is planar.

18. The assembly of claim 17, wherein the interface surface of the base has a total surface area, the first face of the piezoelectric element has a total surface area, and the ratio of the total surface area of the interface surface of the base to the total surface area of the first face of the piezoelectric element is between 0.25 and 1.00.

19. The assembly of claim 18, wherein the ratio of the total surface area of the interface surface of the base to the total surface area of the first face of the piezoelectric element is between 0.50 and 1.00.

20. The assembly of claim 13, wherein the shim connector comprises a conductive material having a coefficient of thermal expansion between −1 and 9 ppm/° C.

21. The assembly of claim 14, wherein the base is attached to the first electrode with a first conductive material and an end of the second wire is attached to the second electrode with a second conductive material, wherein the first conductive material and the second conductive material are each selected from the group consisting of a conductive epoxy or conductive solder.

22. The assembly of claim 14, wherein the piezoelectric element includes a throughbore extending axially between the first face and the second face, wherein the second electrode extends along the second face of the piezoelectric element and at least partially into the throughbore of the piezoelectric element;
wherein the base of the shim connector includes a throughbore; and
wherein the second wire extends through the throughbore of the base and into the throughbore of the piezoelectric element.

* * * * *